(12) United States Patent
Kato et al.

(10) Patent No.: US 9,608,071 B2
(45) Date of Patent: Mar. 28, 2017

(54) IGBT AND IGBT MANUFACTURING METHOD

(75) Inventors: Takehiro Kato, Toyota (JP); Toru Onishi, Toyota (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 0 days.

(21) Appl. No.: 14/378,366

(22) PCT Filed: Feb. 14, 2012

(86) PCT No.: PCT/JP2012/053371
§ 371 (c)(1),
(2), (4) Date: Aug. 13, 2014

(87) PCT Pub. No.: WO2013/121519
PCT Pub. Date: Aug. 22, 2013

(65) Prior Publication Data
US 2015/0008479 A1 Jan. 8, 2015

(51) Int. Cl.
*H01L 29/10* (2006.01)
*H01L 29/66* (2006.01)
(Continued)

(52) U.S. Cl.
CPC ...... *H01L 29/1095* (2013.01); *H01L 29/0834* (2013.01); *H01L 29/6634* (2013.01);
(Continued)

(58) Field of Classification Search
CPC ............ H01L 29/7396; H01L 29/1095; H01L 29/66348; H01L 29/6634; H01L 29/7397; H01L 29/0834
(Continued)

(56) References Cited

U.S. PATENT DOCUMENTS 6,040,599 A 3/2000 Takahashi
2005/0263853 A1 12/2005 Tomomatsu et al.
(Continued)

FOREIGN PATENT DOCUMENTS

CN 1713361 A 12/2005
DE 102007018367 A1 10/2008
(Continued)

OTHER PUBLICATIONS

English Translation of Office Action issued Mar. 10, 2015 in JP Application No. 2013-558611, as concise explanation for Foreign Patent Document Cite No. 1.

*Primary Examiner* — Cuong Q Nguyen
*Assistant Examiner* — Tong-Ho Kim
(74) *Attorney, Agent, or Firm* — Andrews Kurth Kenyon LLP

(57) ABSTRACT

An IGBT manufacturing method is provided. The IGBT has an n-type emitter region, a p-type top body region, an n-type intermediate region, a p-type bottom body region, an n-type drift region, a p-type collector region, trenches penetrating the emitter region, the top body region, the intermediate region and the bottom body region from an upper surface of a semiconductor substrate and reaching the drift region, and gate electrodes formed in the trenches. The method includes forming the trenches on the upper surface of the semiconductor substrate, forming the insulating film in the trenches, forming an electrode layer on the semiconductor substrate and in the trenches after forming the insulating film, planarizing an upper surface of the electrode layer, and implanting n-type impurities to a depth of the intermediate region from the upper surface side of the semiconductor substrate after planarizing the upper surface of the electrode layer.

12 Claims, 19 Drawing Sheets

(51) Int. Cl.
*H01L 29/739* (2006.01)
*H01L 29/08* (2006.01)

(52) U.S. Cl.
CPC .... *H01L 29/66348* (2013.01); *H01L 29/7396* (2013.01); *H01L 29/7397* (2013.01)

(58) Field of Classification Search
USPC ................................. 257/139; 438/135, 138
See application file for complete search history.

(56) References Cited

U.S. PATENT DOCUMENTS

| | | | |
|---|---|---|---|
| 2005/0287743 A1* | 12/2005 | Kim | 438/259 |
| 2007/0096204 A1* | 5/2007 | Shiratake | H01L 27/10894 257/330 |
| 2008/0197379 A1 | 8/2008 | Aono et al. | |
| 2008/0230801 A1 | 9/2008 | Murakoshi et al. | |
| 2011/0068390 A1* | 3/2011 | Ogasawara | H01L 29/0696 257/330 |
| 2011/0201187 A1* | 8/2011 | Nishiwaki et al. | 438/529 |

FOREIGN PATENT DOCUMENTS

| | | |
|---|---|---|
| JP | 64-59868 A | 3/1989 |
| JP | H03-068173 A | 3/1991 |
| JP | H08-316479 A | 11/1996 |
| JP | 2005-268679 A | 9/2005 |
| JP | 2005-347289 A | 12/2005 |
| JP | 2008-205015 A | 9/2008 |
| JP | 2008-205205 A | 9/2008 |
| JP | 2008-235399 A | 10/2008 |
| JP | 2008-251620 A | 10/2008 |
| JP | 2010-103326 A | 5/2010 |

\* cited by examiner

IGBT AND IGBT MANUFACTURING METHOD

CROSS-REFERENCE TO RELATED APPLICATIONS

This is a national phase application based on the PCT International Patent Application No. PCT/JP2012/053371 filed Feb. 14, 2012, the entire contents of which are incorporated herein by reference.

TECHNICAL FIELD

A technique disclosed in the present specification relates to a switching element such as IGBT.

DESCRIPTION OF RELATED ART

Japanese Patent Application Publication No. 2010-103326 (referred to as a patent document 1, hereafter) discloses an IGBT. According to this IGBT, a body region is separated by an n-type intermediate region into a top body region and a bottom body region. Further, this IGBT has trench-type gate electrodes each of which reaches a drift region by penetrating the top body region, the intermediate region, and the bottom body region. By providing the intermediate region in the body region in this way, flow out of holes in the drift region into the top body region while the IGBT is ON can be suppressed. With this arrangement, accumulation of many holes in the drift region becomes possible, and an ON voltage of the IGBT can be reduced.

SUMMARY

Technical Problem

Characteristics of the IGBT having the above intermediate region, particularly, a gate threshold value, the ON voltage, and a capacitance of each gate electrode greatly change depending on an n-type impurity density in the intermediate region in the vicinity of a gate insulating film. Conventionally, it has been difficult to accurately control the n-type impurity density in the intermediate region in the vicinity of a gate insulating film. Accordingly, in mass-producing the IGBT, there has been a problem in that a large variation occurs in characteristics between IGBTs. Therefore, the present specification provides an IGBT having an intermediate region and having a structure in which a variation of characteristics does not easily occur at the time of mass-production.

Solution to Problem

Inventors have found that the n-type impurity density in the intermediate region in the vicinity of a gate insulating film is related to a depth of a lower end of the intermediate region in the vicinity of a gate insulating film. That is, in ion implantation for forming an intermediate region, a depth of implanted ion tends to become larger in the vicinity of the gate insulating film than in other regions due to an influence of a shape of each gate electrode. Therefore, as shown in FIG. 17, for example, a difference ΔD1 occurs between a depth of a lower end of an intermediate region 24 in the vicinity of a gate insulating film 42 and a depth of a lower end of the intermediate region 24 at a position far from the gate insulating film 42. Depending on the depth of the lower end of the intermediate region in the vicinity of the gate insulating film, a density distribution of the n-type impurity in the intermediate region in the vicinity of the gate insulating film (for example, a region indicated by a reference number 24s in FIG. 17) changes. The present inventors have found that the n-type impurity density in the intermediate region in the vicinity of the gate insulating film can be accurately controlled by controlling the depth of the lower end of the intermediate region to a predetermined value.

A first IGBT disclosed in the present specification has an n-type emitter region, a p-type top body region formed under the emitter region, an n-type intermediate region formed under the top body region, a p-type bottom body region formed under the intermediate region, an n-type drift region formed under the bottom body region, a p-type collector region in contact with the drift region, a plurality of trenches penetrating the emitter region, the top body region, the intermediate region and the bottom body region from an upper surface of a semiconductor substrate and reaching the drift region, and gate electrodes formed in the trenches, each of which faces the top body region, the intermediate region and the bottom body region located between the emitter region and the drift region via an insulating film. A variation of a depth of a lower end of the intermediate region located between two gate electrodes is equal to or less than 110 nm.

The variation of the depth of the lower end of the intermediate region located between the two gate electrodes is a difference between a depth of the lower end of a deepest position of the intermediate region and a depth of the lower end of a shallowest position of the intermediate region. For example, in the example shown in FIG. 17, the difference ΔD1 is the variation of the depth of the lower end of the intermediate region 24 between the two gate electrodes 40. FIG. 1 shows a relationship between the variation ΔD1 of the depth of the lower end of the intermediate region located between the two gate electrodes and an n-type impurity density C1 in the intermediate region in the vicinity of a gate insulating film. In FIG. 1, standardized values of the n-type impurity density C1 are indicated. More specifically, FIG. 1 shows how low the n-type impurity density becomes when compared to that in a case where the variation ΔD1 of the depth is zero (a value calculated by simulation). As is clear from FIG. 1, when the variation ΔD1 of the depth is equal to or less than 110 nm, the n-type impurity density C1 becomes constant at a value approximately around 1%. Therefore, when the variation ΔD1 of the depth is equal to or less than 110 nm, the n-type impurity density C1 changes little even when the variation ΔD1 of the depth changes. When the variation ΔD1 of the depth becomes larger than 110 nm, the n-type impurity density C1 rapidly changes. Accordingly, when the variation ΔD1 of the depth is larger than 110 nm, characteristics of the IGBT change even when the variation ΔD1 of the depth changes only slightly. Consequently, as described above, by setting the variation of the depth of the lower end of the intermediate region to equal to or less than 110 nm, the variation of the characteristics of IGBTs can be suppressed at the time of mass-production.

The present specification also provides a method for manufacturing an IGBT that can suppress a variation of a depth of a lower end of an intermediate region. A first manufacturing method disclosed in the present specification is for manufacturing an IGBT that includes an n-type emitter region, a p-type top body region formed under the emitter region, an n-type intermediate region formed under the top body region, a p-type bottom body region formed under the intermediate region, an n-type drift region formed under the bottom body region, a p-type collector region in contact with the drift region, a plurality of trenches penetrating the emitter region, the top body region, the intermediate region and the bottom body region from an upper surface of a semiconductor substrate and reaching the drift region, and gate electrodes formed in the trenches, each of which faces the top body region, the intermediate region and the bottom body region located between the emitter region and the drift region via an insulating film. The manufacturing method includes forming the trenches on the upper surface of the semiconductor substrate, forming the insulating film in the trenches, forming an electrode layer on the semiconductor substrate and in the trenches after forming the insulating film, planarizing an upper surface of the electrode layer, and implanting n-type impurities to a depth of the intermediate region from a side of the upper surface of the semiconductor substrate after planarizing the upper surface of the electrode layer.

Among the electrode layer, the electrode layer formed in each trench is a gate electrode. After the electrode layer is formed, concave portions are formed on the surface of the electrode layer of an upper part of the trench. When impurities are implanted to the semiconductor substrate in this state, an implanted depth of the impurities becomes larger at the vicinity of the trench than in other regions. Therefore, in the present manufacturing method, the surface of the electrode layer is planarized after the electrode layer is formed. Thereafter, n-type impurities are implanted to a depth of the intermediate region from a side of the upper surface of the semiconductor substrate. Accordingly, n-type impurities can be implanted in approximately a constant depth in the semiconductor substrate. Consequently, according to the present method, the intermediate region can be formed in approximately a constant depth, and the variation of the depth of the lower end of the intermediate region can be suppressed.

A second manufacturing method disclosed in the present specification is for manufacturing an IGBT that includes an n-type emitter region, a p-type top body region formed under the emitter region, an n-type intermediate region formed under the top body region, a p-type bottom body region formed under the intermediate region, an n-type drift region formed under the bottom body region, a p-type collector region in contact with the drift region, a plurality of trenches penetrating the emitter region, the top body region, the intermediate region and the bottom body region from an upper surface of a semiconductor substrate and reaching the drift region, and gate electrodes formed in the trenches, each of which faces the top body region, the intermediate region and the bottom body region located between the emitter region and the drift region via an insulating film. The manufacturing method includes forming the trenches on the upper surface of the semiconductor substrate, forming the insulating film in the trenches, forming the gate electrodes in the trenches after forming the insulating film so that upper surfaces of the gate electrodes are located at positions lower than upper ends of the trenches, forming a mask member on each gate electrode or forming a mask member on the semiconductor substrate so that the mask member is thicker on the gate electrodes than in other regions, and implanting n-type impurities to a depth of the intermediate region from a side of the upper surface of the semiconductor substrate after forming the mask member.

After the gate electrodes are formed, a gap (a concave portion) is formed between the upper surface of each gate electrode and the upper surface of the semiconductor substrate. When the impurities are implanted to the semiconductor substrate in this state, an implanted depth of the impurities becomes larger at the vicinity of the trench than in other regions. Therefore, in the present manufacturing method, a mask is formed after the gate electrode is formed. Thereafter, n-type impurities are implanted to a depth of the intermediate region from a side of the upper surface of the semiconductor substrate. Based on the forming of the mask on the gate electrode, the implanted depth of the impurities becoming larger in the vicinity of the trench than in other regions can be prevented. Further, when a mask member is formed on the semiconductor substrate so that the mask member is thicker on the gate electrodes than in other regions, the implanted depth of the impurities becoming larger at the vicinity of the trench than in other regions can be prevented. Accordingly, n-type impurities can be implanted in approximately a constant depth in the semiconductor substrate. Consequently, according to the present method, the intermediate region can be formed in approximately the constant depth, and the variation of the depth of the lower end of the intermediate region can be suppressed.

Further, the present inventors have found that, also in an IGBT having no bottom body region, the variation $\Delta D1$ of a depth of a lower end of the intermediate region located between two gate electrodes gives a large influence to the characteristics of the IGBT. Therefore, the present specification provides a second IGBT.

A second IGBT provided by the present specification has an n-type emitter region, a p-type body region formed under the emitter region, an n-type intermediate region formed under the body region, an n-type drift region formed under the intermediate region, wherein an n-type impurity density in the drift region is lower than that in the intermediate region, and the n-type impurity density is substantially uniform in the drift region, a p-type collector region formed under the drift region, a plurality of trenches penetrating the emitter region, the body region and the intermediate region from an upper surface of a semiconductor substrate and reaching the drift region, and gate electrodes formed in the trenches, each of which faces the body region located between the emitter region and the intermediate region via an insulating film. A variation of a depth of a lower end of the intermediate region located between two gate electrodes is equal to or less than 110 nm.

The variation of the depth of the lower end of the intermediate region in the second IGBT is a difference between the depth of the lower end of a deepest position of the intermediate region and the depth of the lower end of a shallowest position of the intermediate region. FIG. 15 shows a relationship between the variation $\Delta D1$ of the depth of the lower end of the intermediate region located between two gate electrodes and an n-type impurity density C1 in the intermediate region in the vicinity of a gate insulating film. In FIG. 15, standardized values are shown as the n-type impurity density C1. More specifically, FIG. 15 shows how low the n-type impurity density becomes when compared to that in a case where the variation $\Delta D1$ of the depth is zero (a value calculated by simulation). As is clear from FIG. 15, when the variation $\Delta D1$ of the depth is equal to or less than 110 nm, the n-type impurity density C1 becomes constant at a value approximately around 1%. Therefore, when the variation $\Delta D1$ of the depth is equal to or less than 110 nm, the n-type impurity density C1 changes little even when the variation $\Delta D1$ of the depth changes. When the variation $\Delta D1$ of the depth becomes larger than 110 nm, the n-type impurity density C1 changes significantly. Accordingly, when the variation $\Delta D1$ of the depth is larger than 110 nm, characteristics of the IGBT change even when the variation $\Delta D1$ of the depth changes only slightly. Consequently, as described above, by setting the variation of the depth of the lower end of the intermediate region to equal to or less than 110 nm, the variation of the characteristics of IGBTs can be suppressed at the time of mass-production.

The present specification also provides a method for manufacturing an IGBT having no bottom body region, which can suppress a variation of a depth of a lower end of an intermediate region. A third manufacturing method disclosed in the present specification is for manufacturing an IGBT that includes an n-type emitter region, a p-type body region formed under the emitter region, an n-type intermediate region formed under the body region, an n-type drift region formed under the intermediate region, with an n-type impurity density in the drift region being lower than that in the intermediate region, and the n-type impurity being approximately constant in the drift region, a p-type collector region formed under the drift region, a plurality of trenches penetrating the emitter region, the body region, and the intermediate region from an upper surface of a semiconductor substrate and reaching the drift region, and gate electrodes formed in the trenches, each of which faces the body region located between the emitter region and the intermediate region via an insulating film. The manufacturing method includes forming the trenches on the upper surface of the semiconductor substrate, forming the insulating film in the trenches, forming an electrode layer on the semiconductor substrate and in the trenches after forming the insulating film, planarizing an upper surface of the electrode layer, and implanting n-type impurities to a depth of the intermediate region from a side of the upper surface of the semiconductor substrate after planarizing the upper surface of the electrode layer.

According to the present method, the intermediate region can be formed in approximately a constant depth, and the variation of the depth of the lower end of the intermediate region can be suppressed.

A fourth manufacturing method disclosed in the present specification is for manufacturing an IGBT that includes an n-type emitter region, a p-type body region formed under the emitter region, an n-type intermediate region formed under the body region, an n-type drift region formed under the intermediate region, with an n-type impurity density in the drift region being lower than that in the intermediate region, and the n-type impurity density being substantially uniform in the drift region, a p-type collector region firmed under the drift region, a plurality of trenches penetrating the emitter region, the body region, and the intermediate region from an upper surface of a semiconductor substrate and reaching the drift region, and gate electrodes formed in the trenches, each of which faces the body region located between the emitter region and the intermediate region via an insulating film. The manufacturing method includes forming the trenches on the upper surface of the semiconductor substrate, forming the insulating film in the trenches, forming the gate electrodes in the trenches after forming the insulating film so that upper surfaces of the gate electrodes are located at positions lower than upper ends of the trenches, forming a mask member on each gate electrode or forming a mask member on the semiconductor substrate so that the mask member is thicker on the gate electrodes than in other regions, and implanting n-type impurities to a depth of the intermediate region from a side of the upper surface of the semiconductor substrate after forming the mask member.

According to the present method, the intermediate region can be formed in approximately a constant depth, and the variation of the depth of the lower end of the intermediate region can be suppressed.

DESCRIPTION OF EMBODIMENTS

Figure 2:
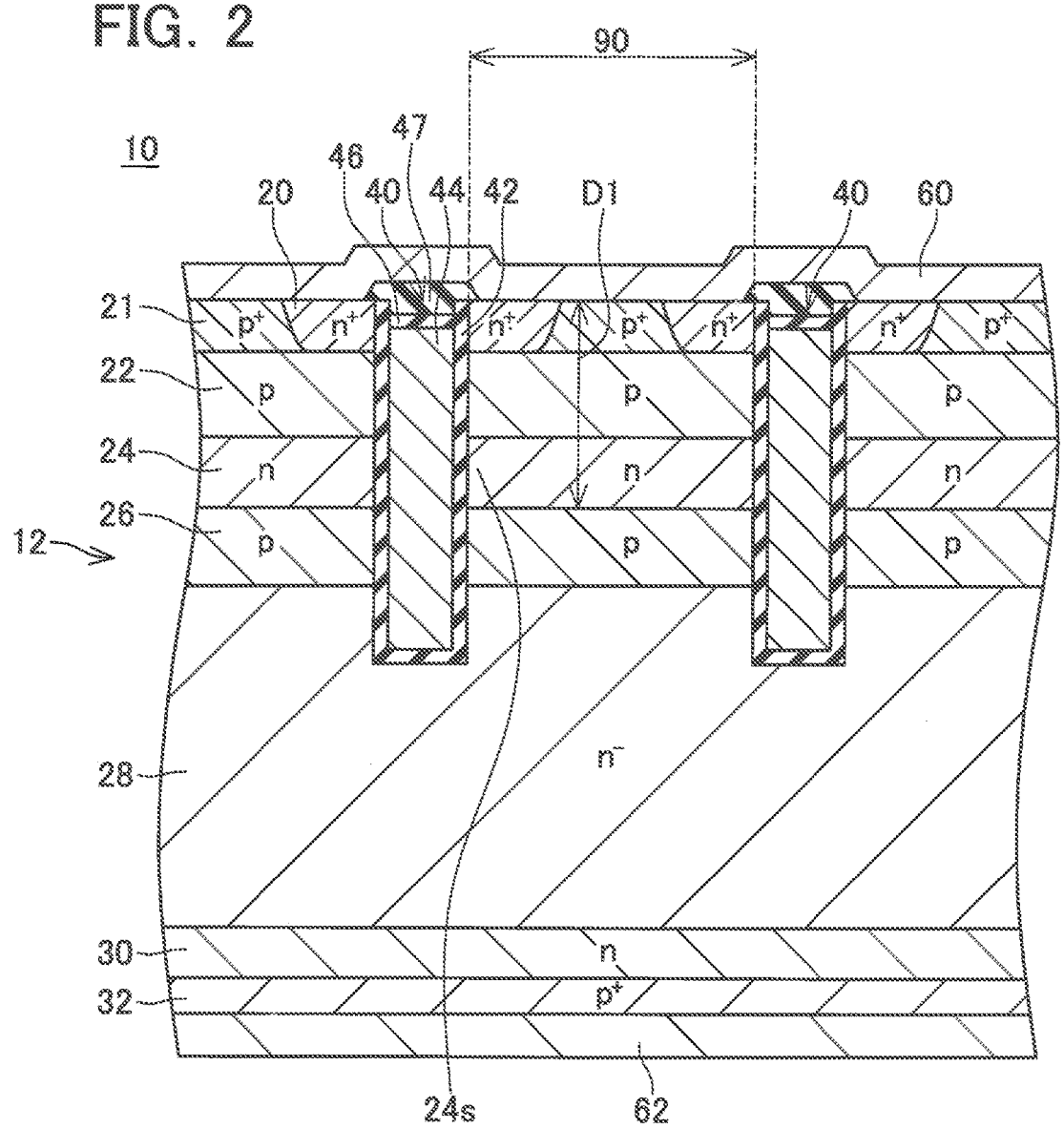
FIG. 2 is a cross-sectional view of an IGBT 10 according to an embodiment (a cross-sectional view along a line II-II in FIG. 3)

An IGBT 10 according to an embodiment shown in FIG. 2 is configured by a semiconductor substrate 12, and electrodes, an insulating film, etc. formed on an upper surface and a lower surface of the semiconductor substrate 12.

Figure 3:
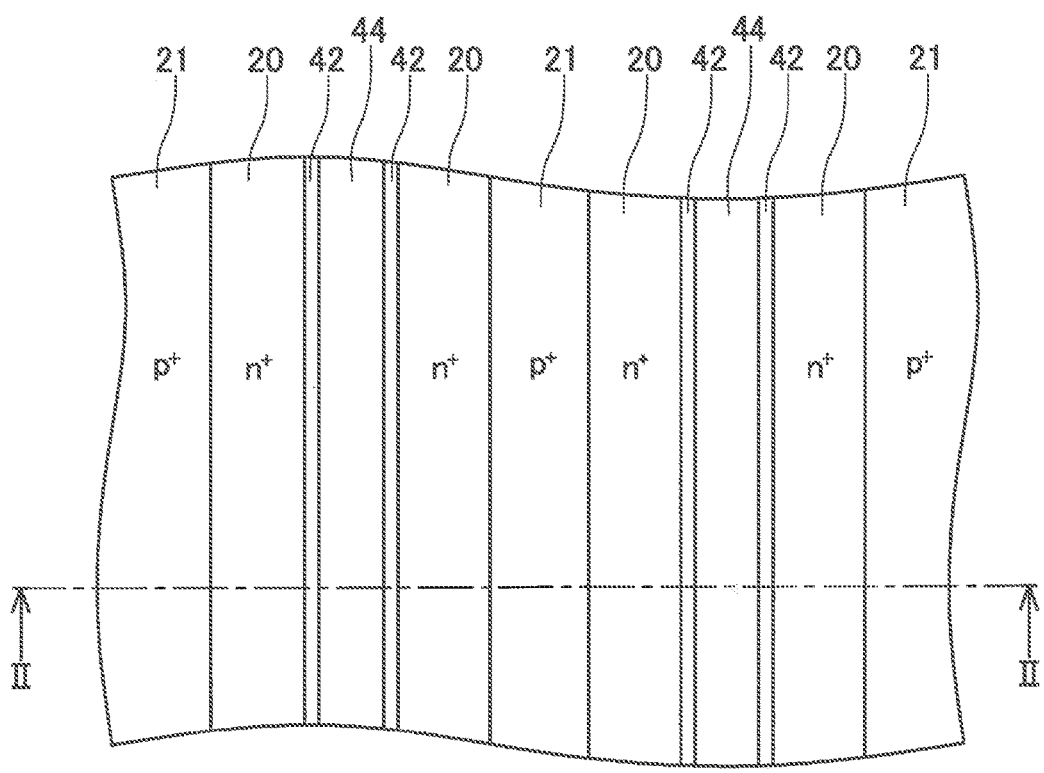
FIG. 3 is a top view of a semiconductor substrate 12 of the IGBT 10 according to the embodiment.

A plurality of trenches 40 is formed on an upper surface of the semiconductor substrate 12. An inner surface of each trench 40 is covered with a gate insulating film 42. A gate electrode 44 is formed on the inner surface of each trench 40. An upper surface of the gate electrode 44 is covered with a cap insulating film 46. An interlayer insulating film 47 is formed on the cap insulating film 46. However, the gate electrodes 44 can be connected to the outside, at positions not shown. As shown in FIG. 3, the gate electrodes 44 are extended parallel to each other.

In the semiconductor substrate 12, there are formed emitter regions 20, a body contact region 21, a top body region 22, a floating region 24, a bottom body region 26, a drift region 28, a buffer region 30, and a collector region 32.

The emitter regions 20 are n-type regions, and are selectively formed in ranges exposed to the upper surface of the semiconductor substrate 12. The emitter regions 20 are in contact with the gate insulating film 42. As shown in FIG. 3, the emitter regions 20 are extended in parallel along the gate electrodes 44.

The body contact region 21 is a p-type region with a high p-type impurity density. The body contact region 21 is formed between two emitter regions 20. The body contact region 21 is exposed to the upper surface of the semiconductor substrate 12.

The top body region 22 is a p-type region with a lower p-type impurity density than that of the body contact region. The top body region 22 is formed under the emitter region 20 and the body contact region 21. The top body region 22 is in contact with the gate insulating films 42 under the emitter region 20.

The floating region 24 is an n-type region, and is formed under the top body region 22. The floating region 24 is separated from the emitter region 20 by the top body region 22. The floating region 24 is in contact with the gate insulating films 42. When the n-type impurity density in the floating region 24 becomes higher, the ON voltage of the IGBT 10 becomes lower. On the other hand, when the n-type impurity density in the floating region 24 is increased to a predetermined value, a withstand voltage characteristic of the IGBT 10 is aggravated rapidly. Therefore, the n-type impurity density in the floating region 24 is set to a highest value in a range not aggravating the withstand voltage characteristic. The floating region 24 is an intermediate region that separates the top body region 22 from the bottom body region 26.

The bottom body region 26 is a p-type region, and is formed under the floating region 24. The bottom body region 26 is separated from the top body region 22 by the floating region 24. The bottom body region 26 is in contact with the gate insulating films 42.

The drift region 28 is an n-type region having a low density n-type impurity. The drift region 28 is formed under the bottom body region 26. The drift region 28 is separated from the floating region 24 by the bottom body region 26. The drift region 28 is in contact with the gate insulating films 42 located at lower ends of the trenches 40.

The buffer region 30 is an n-type region having a higher density n-type impurity than that in the drift region 28. The buffer region 30 is formed under the drift region 28.

The collector region 32 is a p-type region having high density p-type impurities. The collector region 32 is formed in a range exposed to the lower surface of the semiconductor substrate 12. The collector region 32 is separated from the bottom body region 26 by the drift region 28 and the buffer region 30.

As described above, because each region is formed in the semiconductor substrate 12, each trench 40 is disposed to penetrate the emitter region 20, the top body region 22, the floating region 24, and the bottom body region 26, and reach the drift region 28. Further, the gate electrode 44 faces the emitter region 20, the top body region 22, the floating region 24, and the bottom body region 26, via the gate insulating film 42 on a side surface of the trench 40.

An emitter electrode 60 is formed on the upper surface of the semiconductor substrate 12. The emitter electrode 60 is in ohmic connection with the emitter region 20 and the body contact region 21. The emitter electrode 60 is insulated from the gate electrode 44 by the cap insulating film 46 and the interlayer insulating film 47. A collector electrode 62 is formed on the lower surface of the semiconductor substrate 12. The collector electrode 62 is in ohmic connection with the collector region 32.

The operation of the IGBT 10 will be described next. When a voltage equal to or above a gate threshold voltage (a gate voltage that is minimum necessary to turn on the IGBT 10) is applied to the gate electrode 44 in a state that a voltage for making the collector electrode 62 plus is applied to between the emitter electrode 60 and the collector electrode 62, the IGBT 10 is turned on. That is, channels are formed in the top body region 22 and the bottom body region 26 in ranges that are in contact with the gate insulating film 42, and electrons flow from the emitter region 20 to the collector region 32 through the channels. At the same time, holes flow from the collector region 32 into the drift region 28. Based on the flow of the holes into the drift region 28, a conductivity modulation phenomenon occurs in the drift region 28, and electric resistance in the drift region 28 becomes low. Therefore, electrons flow in the drift region 28 with low loss. Further, the holes that flow into the drift region 28 flow next from the drift region 28 toward the top body region 22. However, the floating region 24 becomes a barrier, and move of the holes toward the top body region 22 is suppressed. Therefore, a density of the holes in the drift region 28 becomes high, and the electric resistance in the drift region 28 is further reduced. Consequently, the ON voltage of the IGBT 10 is reduced.

Further, because the bottom body region 26 is formed, the withstand voltage of the IGBT 10 improves. As a result, the withstand voltage of a target value can be obtained.

Figure 4:
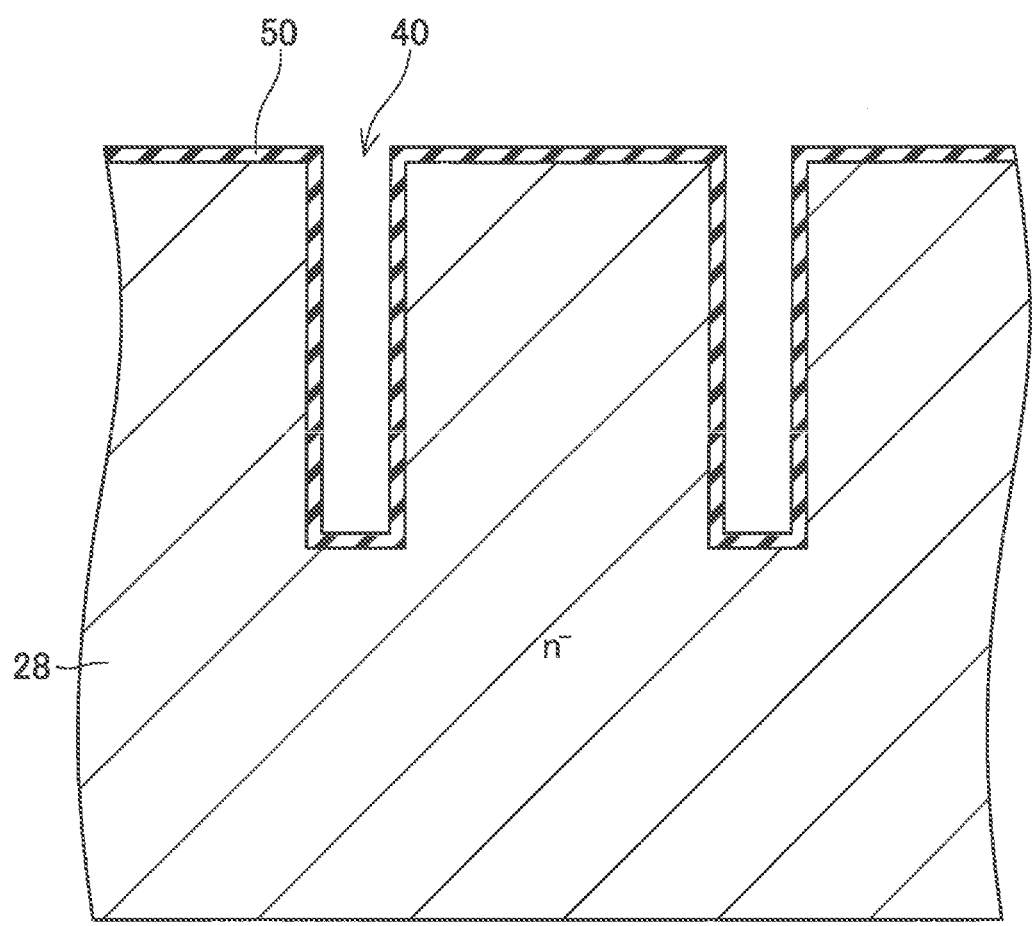
FIG. 4 is an explanatory view of a manufacturing method according to a first example.
Figure 5:
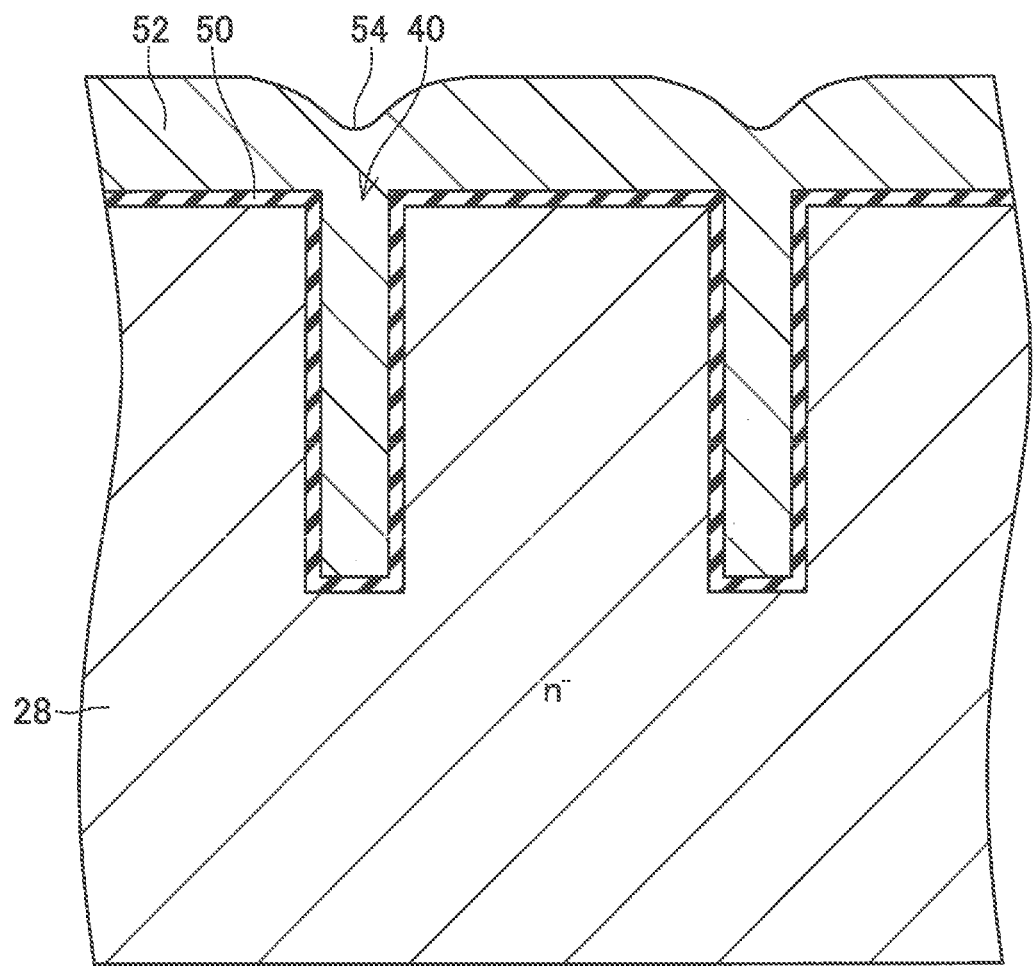
FIG. 5 is an explanatory view of the manufacturing method according to the first example.
Figure 6:
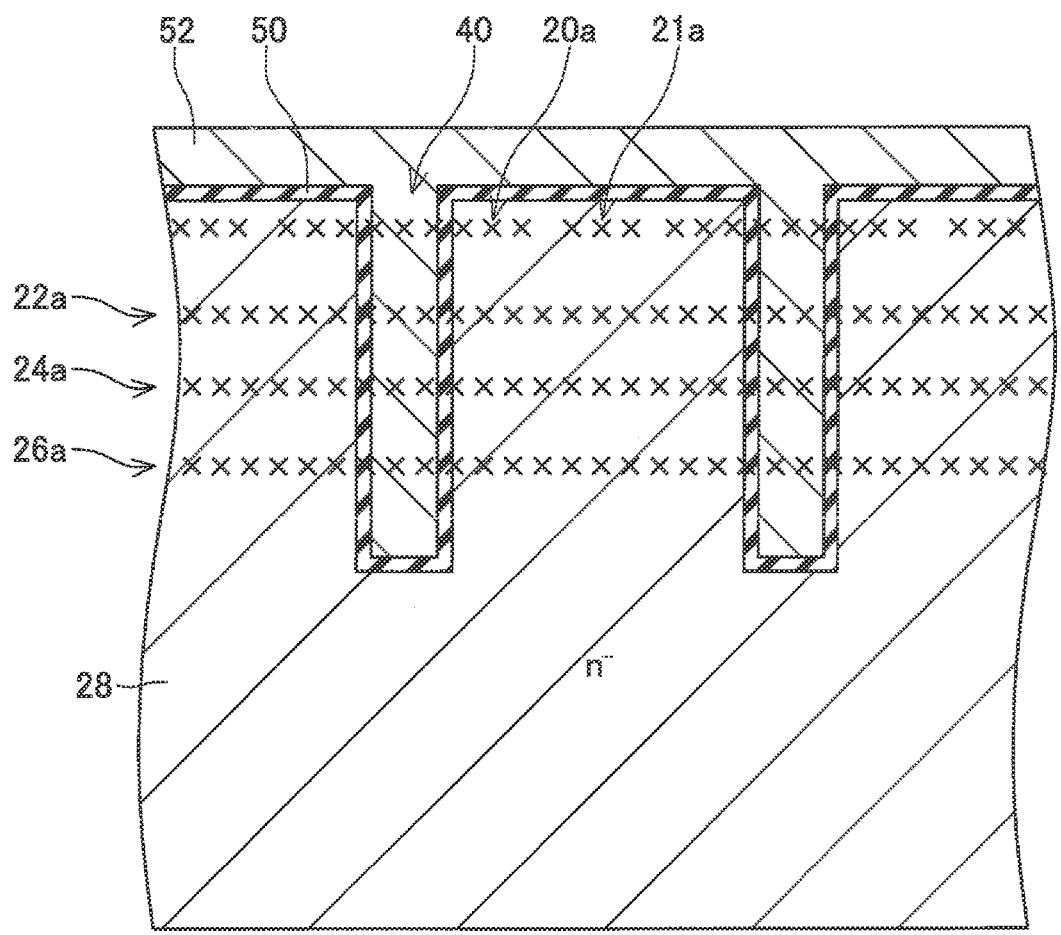
FIG. 6 is an explanatory view of the manufacturing method according to the first example.
Figure 7:
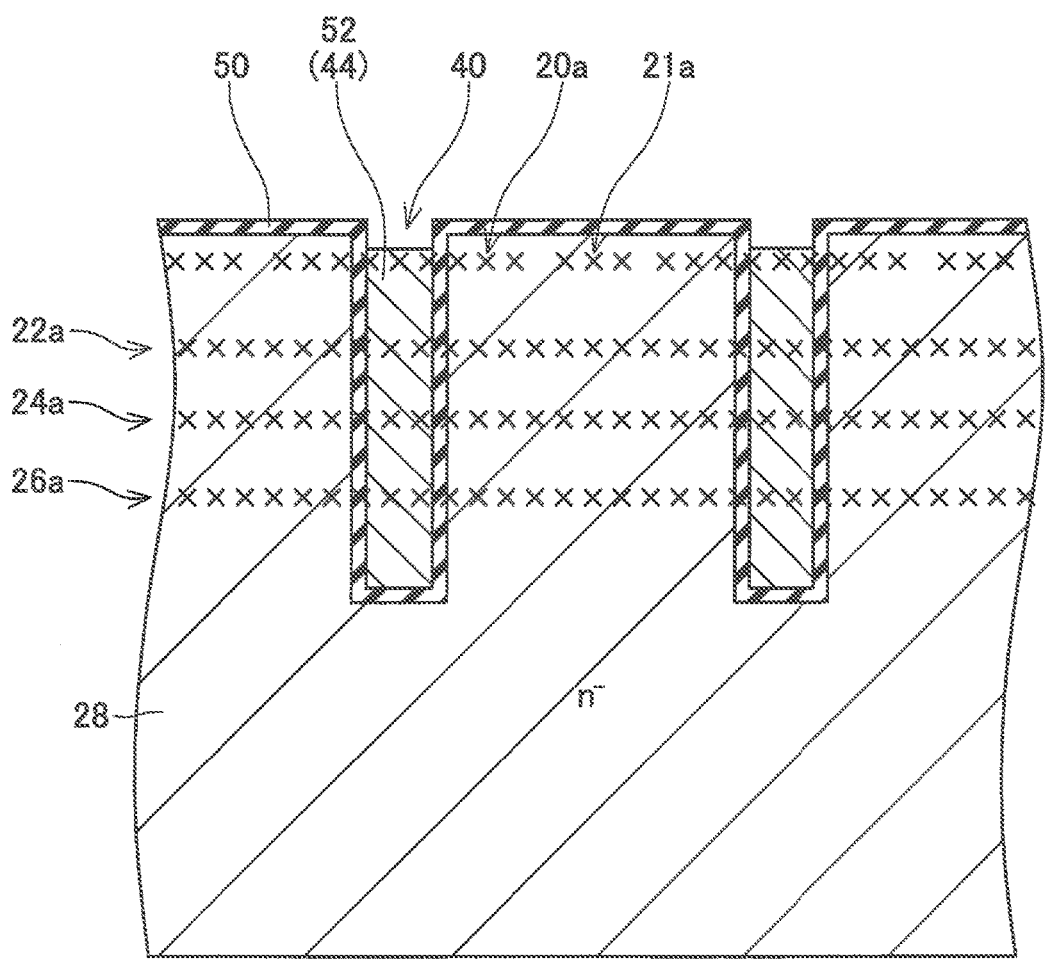
FIG. 7 is an explanatory view of the manufacturing method according to the first example.
Figure 8:
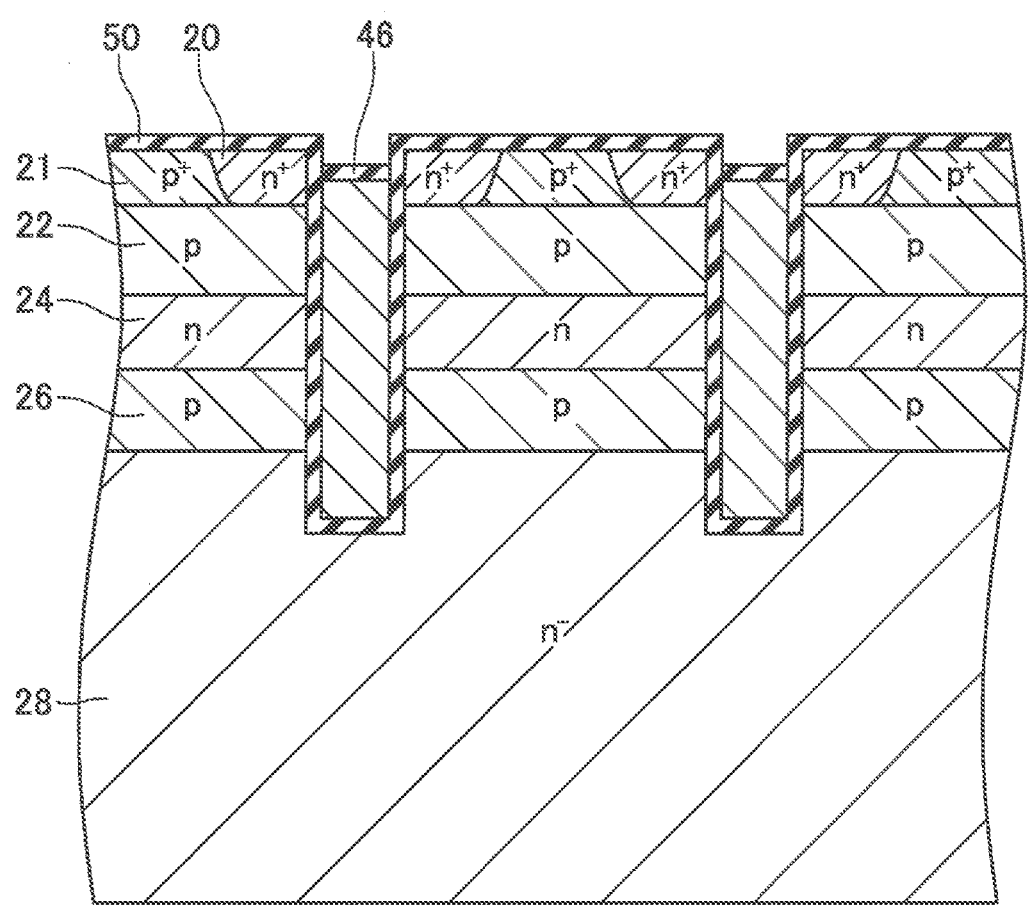
FIG. 8 is an explanatory view of the manufacturing method according to the first example.

Next, a method for manufacturing the IGBT 10 will be described in comparison with a conventional method for manufacturing a IGBT. First, as the method for manufacturing the IGBT 10, a manufacturing method according to a first example will be described. The IGBT 10 is manufactured from an n-type semiconductor substrate (a silicon substrate) having approximately the same n-type impurity density as that in the drift region 28. First, the trenches 40 are formed by etching on the upper surface of the semiconductor substrate. Next, an insulating film 50 is formed on the upper surface of the semiconductor substrate and on an inner surface of each trench 40, as shown in FIG. 4, by oxidation, a CVD method, or the like. Next, an electrode layer 52 made of polysilicon is formed on the upper surface of the semiconductor substrate and in each trench 40, as shown in FIG. 5, by a PVD method, the CVD method, or the like. At this time, due to an influence of a shape of the trench 40, concave portions 54 are formed on a surface of the electrode layer 52 above the trench 40. Next, an upper surface of the electrode layer 52 is planarized, as shown in FIG. 6, by grinding, polishing, etching, CMP, or the like. Accordingly, the concave portions 54 are extinguished. Next, impurity ions are implanted to the semiconductor substrate from a side of the upper surface of the semiconductor substrate. In this case, n-type impurities are implanted to the emitter region 20, p-type impurities are implanted to the body contact region 21, p-type impurities are implanted to the top body region 22, n-type impurities are implanted to the floating region 24, and n-type impurities are implanted to the bottom body region 26. Reference numbers 20a to 26a in FIG. 6 denote positions where the impurities are implanted. The reference number 20a denotes a position where n-type impurities are implanted to the emitter region 20 by the ion implantation. The reference number 21a denotes a position where the p-type impurities are implanted to the body contact region 21 by the ion implantation. The reference number 22a denotes a position where the p-type impurities are implanted to the top body region 22 by the ion implantation. The reference number 24a denotes a position where n-type impurities are implanted to the floating region 24 by the ion implantation. The reference number 26a denotes a position where the p-type impurities are implanted to the bottom body region 26 by the ion implantation. As shown in the drawing, in each ion implantation, impurities are also implanted to the electrode layer 52 and the insulating film 50 in the trench 40. At the time of ion implantation, resistance (a rate of deceleration when ions proceed by a unit distance) of the electrode layer 52 and the insulating film 50 and resistance of a semiconductor layer are approximately equal. Therefore, by implanting the impurities after the upper surface of the electrode layer 52 is planarized as described above, a depth of the implantation of the impurities to the electrode layer 52 and the insulating film 50 in the trench 40 and a depth of the implantation of the impurities to the semiconductor layer outside the trench 40 can be set approximately equal. Next, the electrode layer 52 that is unnecessary is removed by etching. At this time, the electrode layer 52 is left in the trench 40 as shown in FIG. 7. The electrode layer 52 that is left in the trench 40 becomes the gate electrode 44. Next, the cap insulating film 46 is formed on the upper surface of the gate electrode 44 by oxidation, the CND method, or the like. Next, by heat treating the semiconductor substrate, impurities implanted in the semiconductor substrate can be diffused and activated. Accordingly, as shown in FIG. 8, the emitter region 20, the body contact region 21, the top body region 22, the floating region 24, and the bottom body region 26 are formed in the semiconductor substrate. Because depths of ion implantation in the trench 40 and outside the trench 40 at the time of ion implantation are approximately equal, each region is formed in approximately a constant depth as shown in FIG. 8. As shown in FIG. 8, after each region is formed, other necessary regions are formed in the semiconductor substrate, and necessary electrodes, insulating films or the like are formed on the surface of the semiconductor substrate. As a result, the IGBT 10 in FIG. 2 is completed.

Figure 17:
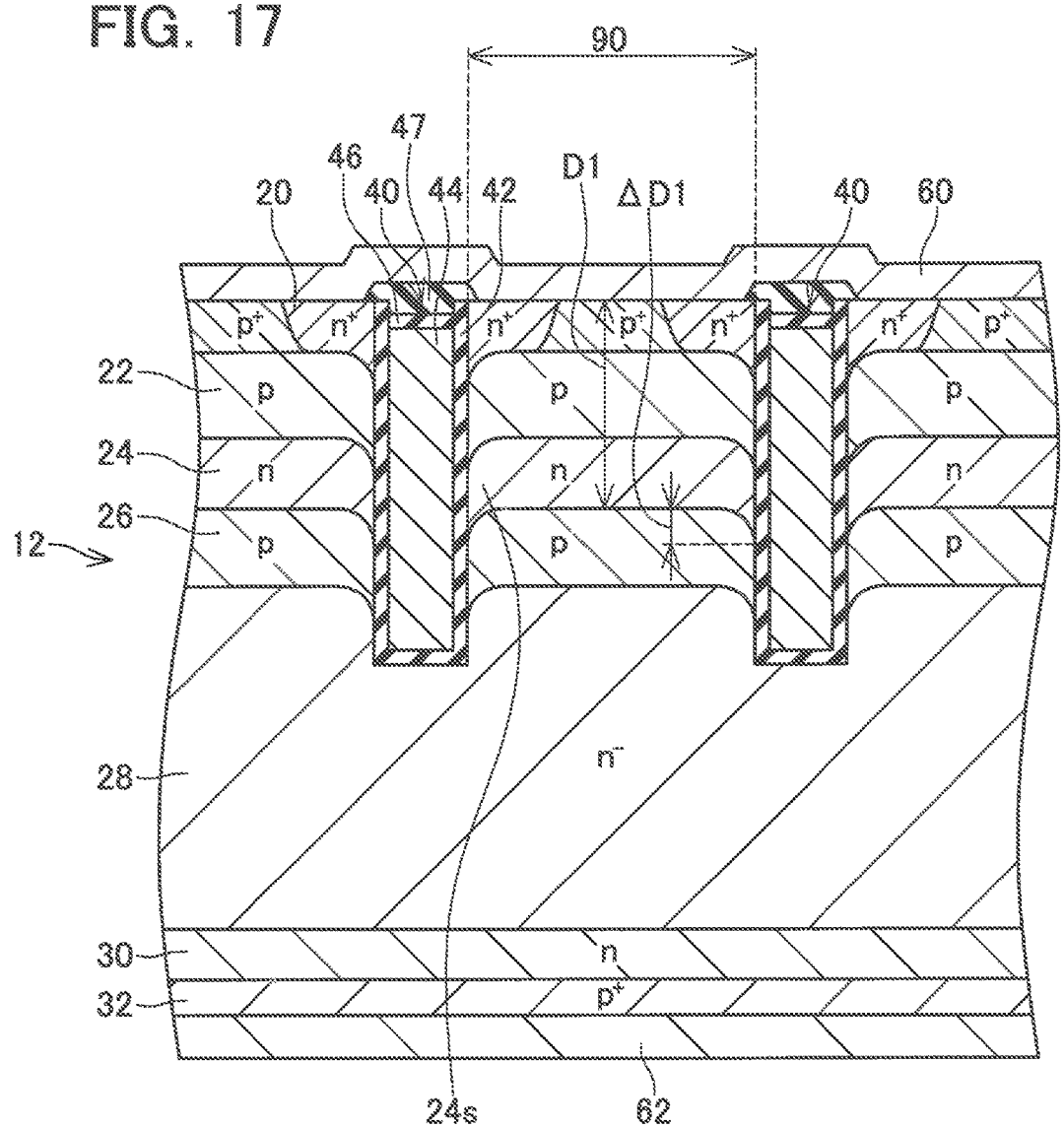
FIG. 17 is a cross-sectional view of a conventional IGBT having a bottom body region.
Figure 18:
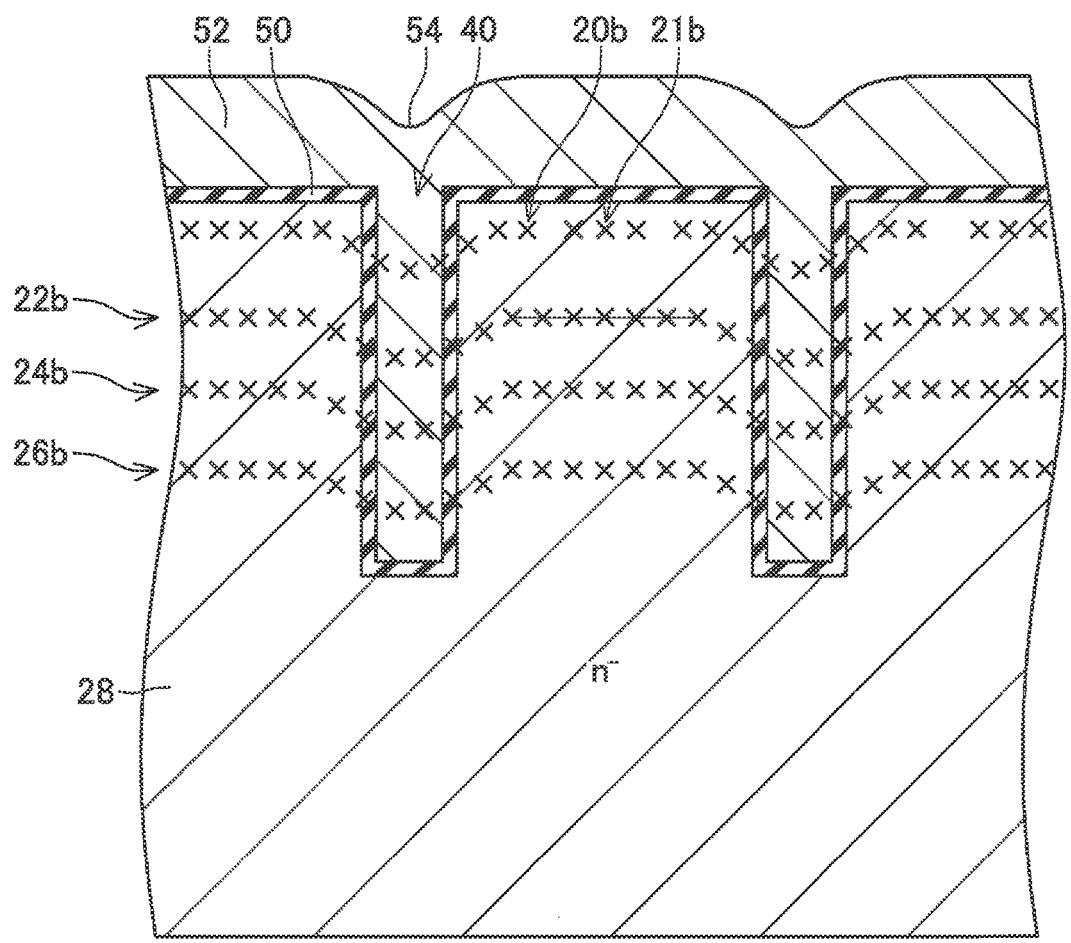
FIG. 18 is an explanatory view of a method for manufacturing a conventional IGBT having a bottom body region.

Next, the conventional method for manufacturing the IGBT will be described. In the conventional method for manufacturing the IGBT, processing up to a state shown in FIG. 5 is performed to a semiconductor substrate in a similar manner to that of the manufacturing method in the first example. Next, impurity ions are implanted to the semiconductor substrate from a side of the upper surface of the semiconductor substrate, without planarizing the upper surface of the electrode layer 52. Reference numbers 20b to 26b in FIG. 18 denote positions where impurities are implanted by this manufacturing method to the emitter region 20, the body contact region 21, the top body region 22, the floating region 24, and the bottom body region 26. Because the concave portions 54 are formed on the upper surface of the electrode layer 52, an implanted depth of the impurities becomes larger in the vicinity of the trench 40 than at a position far from the trench 40. Thereafter, by performing a process similar to that of the manufacturing method in the first example, the conventional IGBT shown in FIG. 17 is manufactured. Because the implanted depth of the impurities becomes larger in the vicinity of the trench 40 at the time of ion implantation, the emitter region 20, the top body region 22, the floating region 24, and the bottom body region 26 formed deeper only in the vicinity of the trench 40 (that is, the gate insulating film 42), as shown in FIG. 17.

As another conventional manufacturing method, there is also a method for forming a trench, a gate insulating film, and a gate electrode, after forming each semiconductor region of an emitter region, a top body region, a floating region, and a bottom body region. However, according to this manufacturing method, at the time of forming the gate insulating film, there occurs a phenomenon that p-type impurities and n-type impurities in the semiconductor layer are absorbed in the gate insulating film or move via the gate insulating film. Therefore, by this method, each semiconductor region cannot be formed in a uniform depth or the impurity density in the vicinity of the gate insulating film cannot be accurately controlled either.

Figure 1:
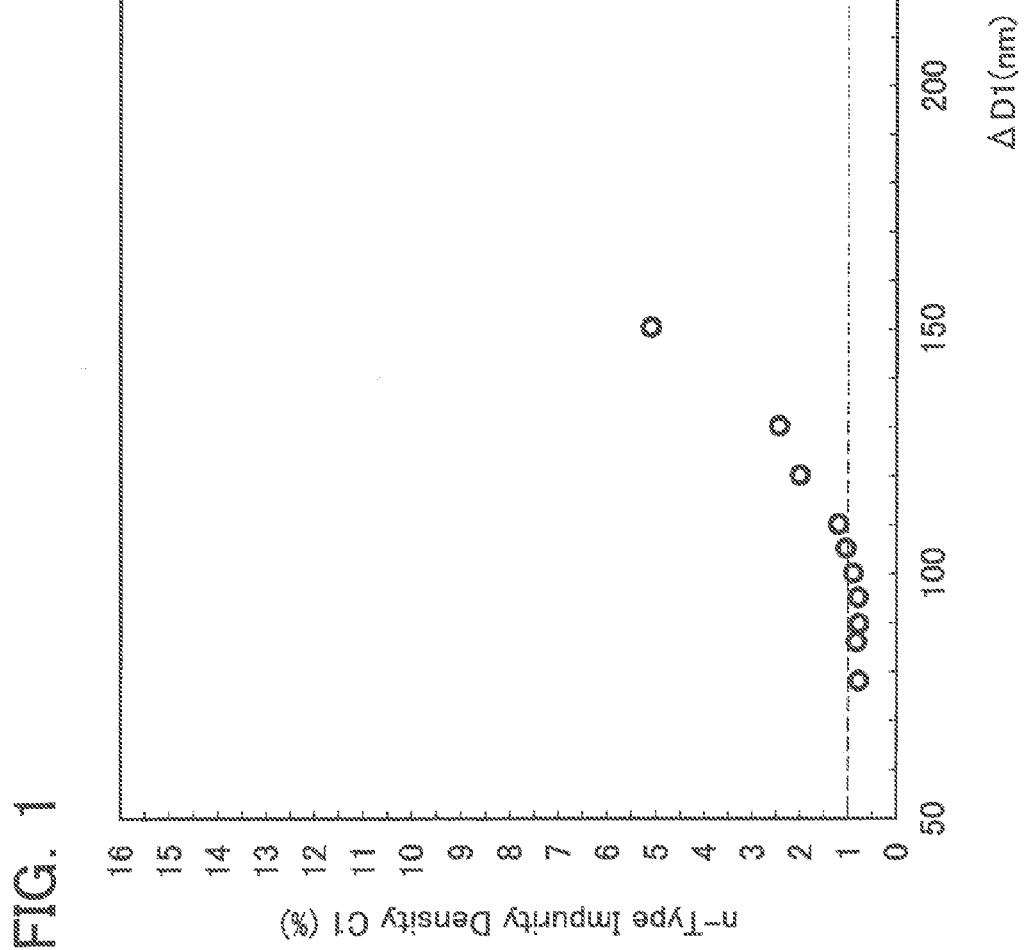
FIG. 1 is a graph showing a relationship between a variation $\Delta D1$ of a depth of a lower end of an intermediate region and an n-type impurity density $C1$ in the intermediate region in the vicinity of a gate insulating film, in an IGBT having a bottom body region.

As described above, according to the manufacturing method in the first example, it becomes possible to form the emitter regions 20, the top body region 22, the floating region 24, and the bottom body region 26, in more uniform depths than those by the conventional manufacturing method. The depths of these regions influence the characteristics of the IGBT. Particularly, a variation of a depth D1 (refer to FIGS. 2 and 17) of the lower end of the floating region 24s gives a great influence to the characteristics of the IGBT (the gate threshold value, the ON voltage, and the capacitance of each gate electrode). That is, like the conventional IGBT in FIG. 17, when a position of the lower end of the floating region 24 becomes deep in the vicinity of the gate insulating film 42, the n-type impurity density in the floating region 24 in the vicinity of the gate insulating film 42 becomes low. As a result, the characteristics of the IGBT are influenced. FIG. 1 shows a relationship between the variation ΔD1 (a difference between a depth of a shallowest position and a depth of a deepest position) of the depth D1 of the lower end of the floating region 24 in the region 90 between two gate electrodes 44 (refer to FIGS. 2 and 17) and the n-type impurity density C1 in the floating region 24s in the vicinity of the trench 40. For example, according to the conventional IGBT the variation ΔD1 of a depth becomes in a size of a portion indicated by the reference number ΔD1 in FIG. 17. Further, in the IGBT 10 in FIG. 2, because the ΔD1 is extremely small, the ΔD1 is not shown. As shown in FIG. 1, when the variation ΔD1 of the depth is larger than 110 nm, the n-type impurity density C1 greatly changes even when the variation ΔD1 of the depth changes only slightly. On the other hand, when the variation D1 of the depth is equal to or less than 110 nm, the n-type impurity density C1 changes little even when the variation ΔD1 of the depth slightly changes. According to the above manufacturing method in the first example, the variation ΔD1 of the depth can be set equal to or less than 110 nm. By mass-producing the IGBT so that the variation ΔD1 of a depth becomes equal to or less than 110 nm, the variation of the n-type impurity density C1 in the floating region 24s between the mass-produced IGBTs can be suppressed. Consequently, the IGBT of stable characteristics can be mass-produced. That is, according to the structure that the variation ΔD1 of the depth is equal to or less than 110 nm, the variation in the characteristics of the IGBT at the time of mass-production can be suppressed.

Figure 9:
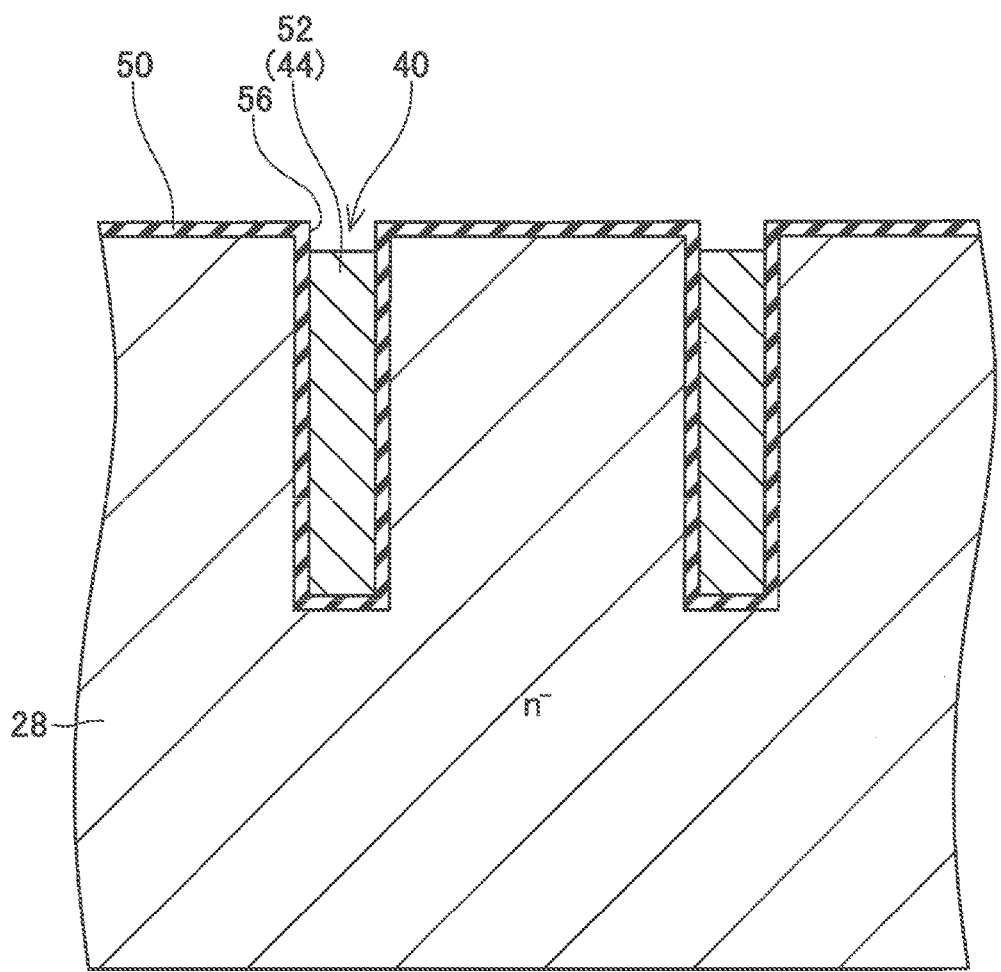
FIG. 9 is an explanatory view of a manufacturing method according to a second example.
Figure 10:
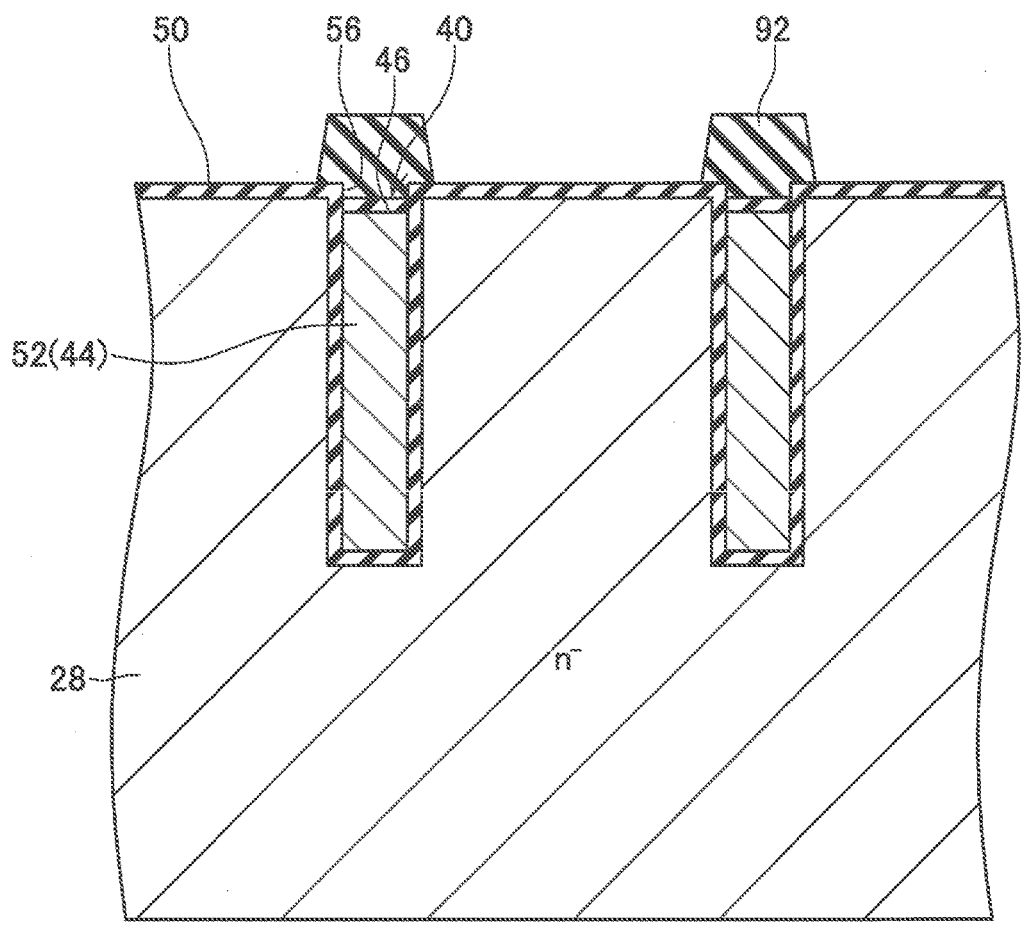
FIG. 10 is an explanatory view of the manufacturing method according to the second example.

A manufacturing method according to a second example will be described. In the manufacturing method according to the second example, a semiconductor substrate up to the state shown in FIG. 5 is also processed in a similar manner to that of the manufacturing method according to the first example. Next, as shown in FIG. 9, the electrode layer 52 on the semiconductor substrate is removed by etching, and the electrode layer 52 (the gate electrode 44) is left in the trench 40. At this time, the upper surfaces of the gate electrodes 44 are positioned at a lower side than the upper surface of the semiconductor substrate. That is, concave portions 56 are formed on the upper surface of the semiconductor substrate. Next, the cap insulating film 46 is formed on the upper surface of the gate electrode 44 by oxidation, the CVD method, or the like. Next, mask layers 92 are formed on the gate electrodes 44 (that is, on the trenches 40), as shown in FIG. 10. The mask layers 92 are formed by an inkjet method, a photolithography technique, or the like. At this time, the mask layers 92 are not formed on the semiconductor layer other than the trenches 40. Next, impurity ions are implanted to the semiconductor substrate from a side of the upper surface of the semiconductor substrate. In this case, n-type impurities are implanted to the emitter regions 20, p-type impurities are implanted to the body contact region 21, p-type impurities are implanted to the top body region 22, n-type impurities are implanted to the floating region 24, and n-type impurities are implanted to the bottom body region 26. At this time, by the mask layers 92 formed on the gate electrodes 44, the implanted depth of the impurities to the vicinities of the gate electrodes 44 is prevented from becoming large. Consequently, the implanted depth of the impurities to the vicinities of the gate electrodes 44 and an implanted depth of the impurities to the semiconductor layer become approximately equal. Thereafter, a process approximately similar to that in the first example is performed, and manufacturing of the IGBT 10 in FIG. 2 is completed as a result. As described above, according to the manufacturing method in the second example, the implanted depth of the impurities into the trenches 40 and the implanted depth of the impurities to the semiconductor layer other than the trenches 40 can be set approximately equal, without the influence of a shape of the concave portions 56. Therefore, according to the manufacturing method in the second example, the IGBT in FIG. 2 having each region formed in approximately a constant depth can be manufactured.

Figure 11:
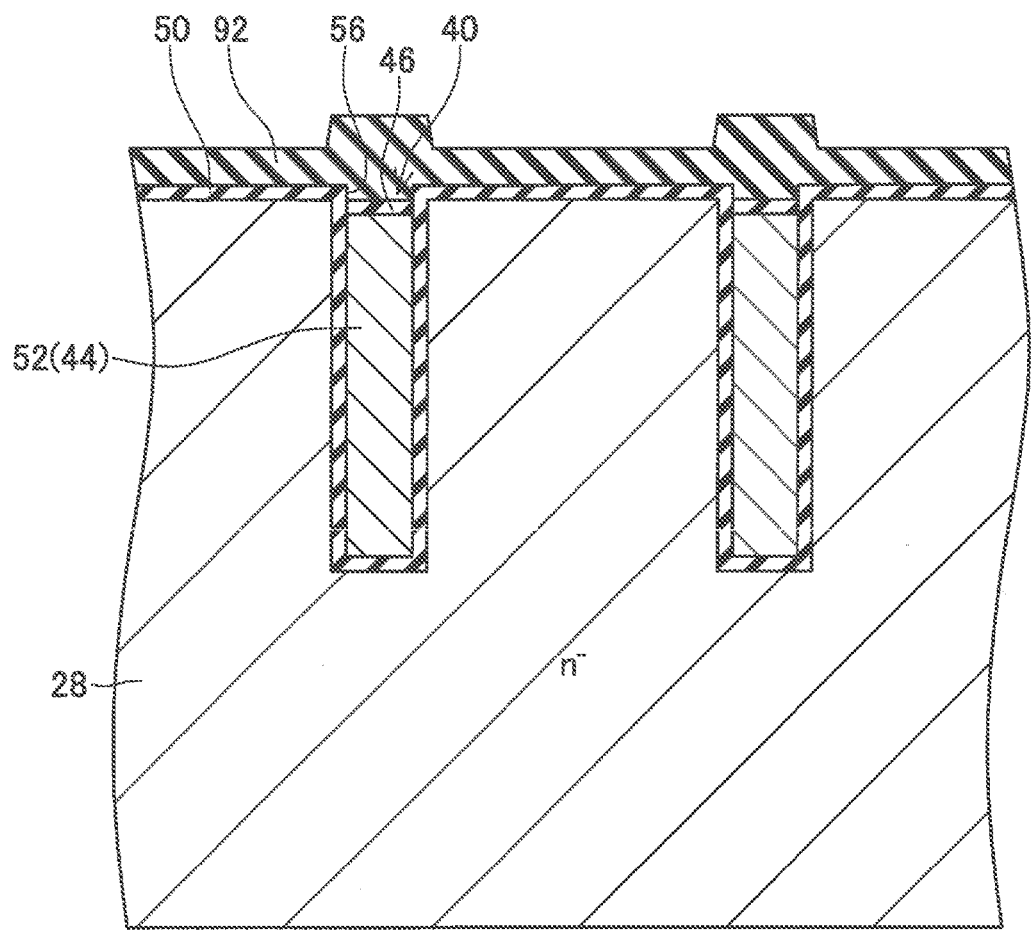
FIG. 11 is an explanatory view of a manufacturing method according to a third example.
Figure 12:
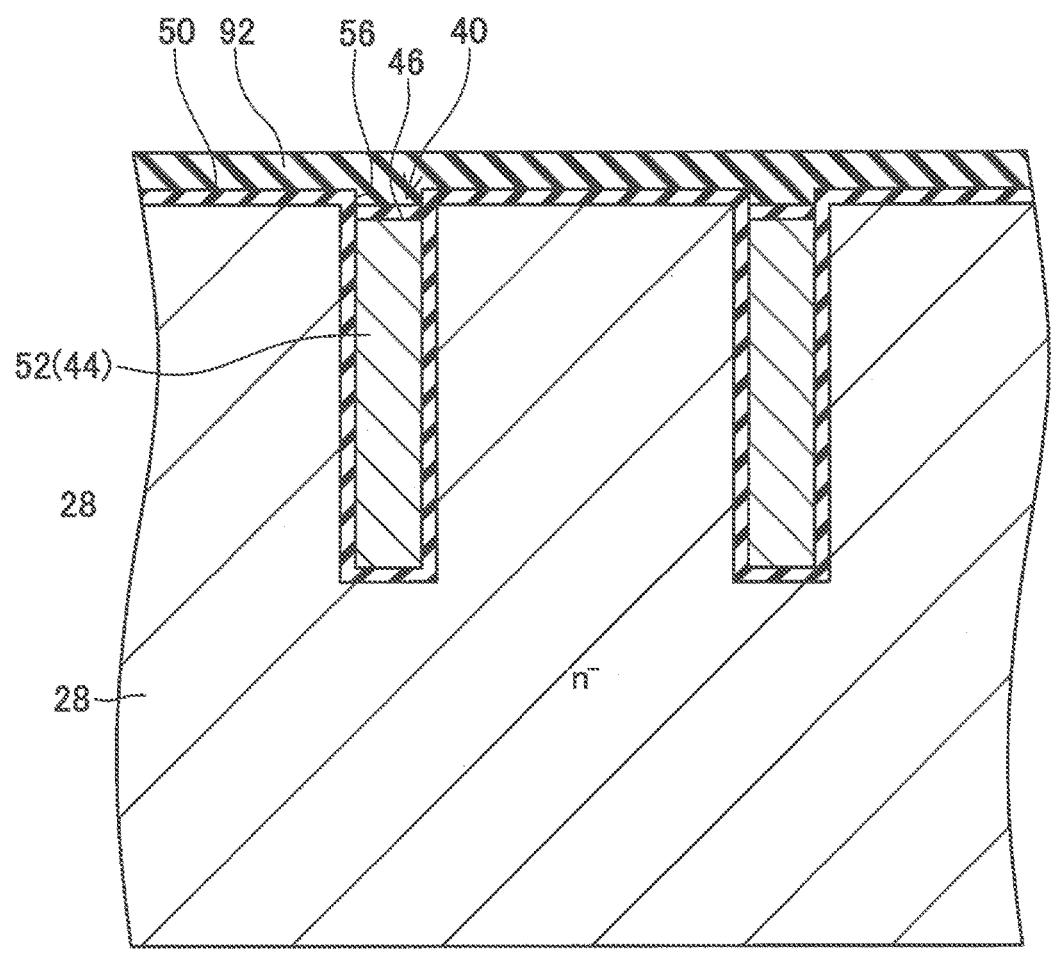
FIG. 12 is an explanatory view of a manufacturing method according to a fourth example.
Figure 13:
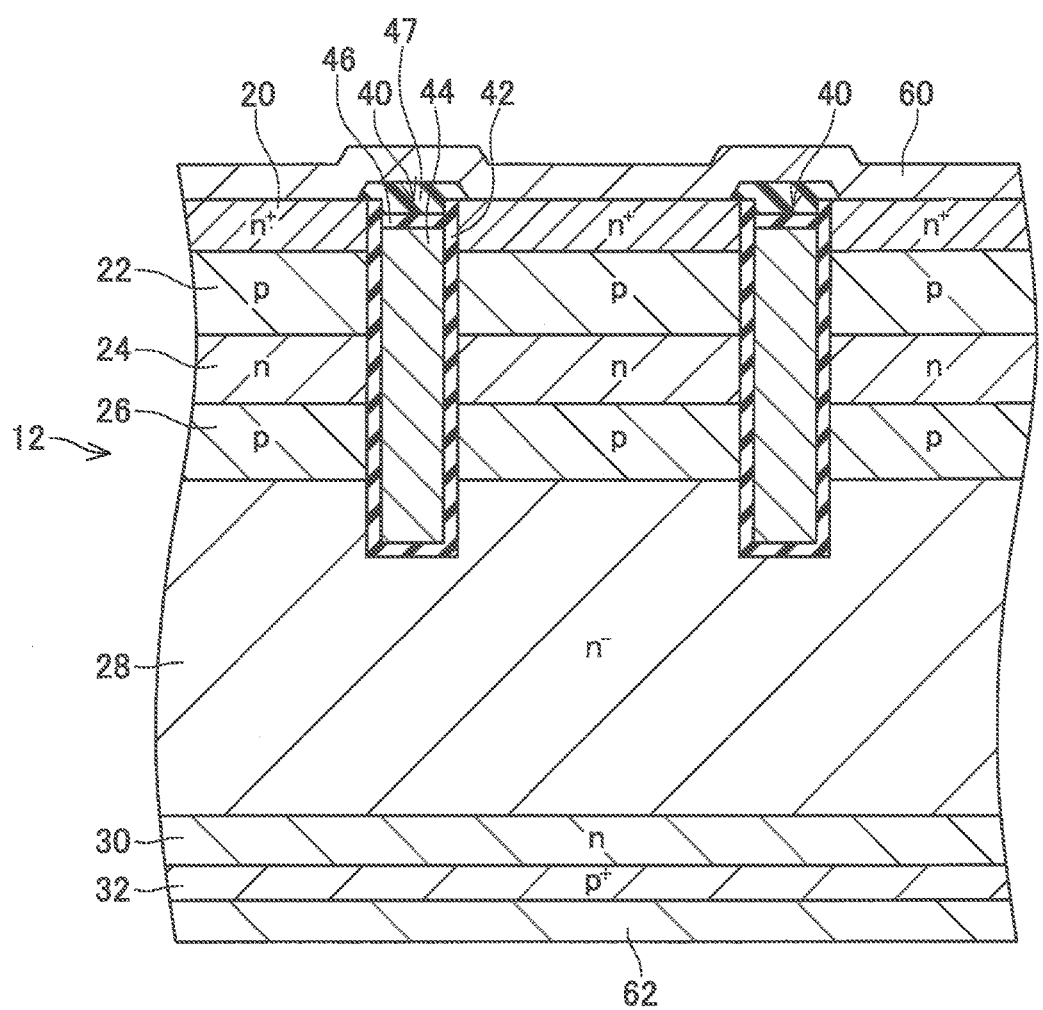
FIG. 13 is a cross-sectional view of an IGBT according to another embodiment (a cross-sectional view along a line XIII-XIII in FIG. 14)
Figure 14:
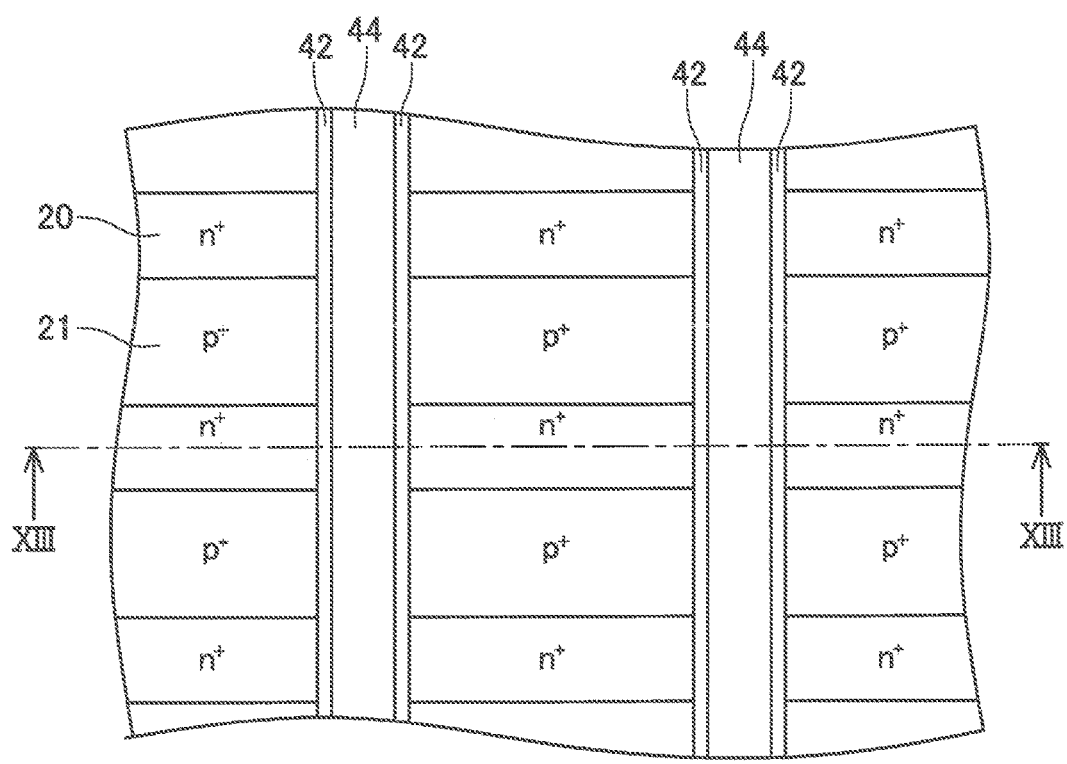
FIG. 14 is a top view of the semiconductor substrate 12 of the IGBT according to the other embodiment.

In the second example, the mask layer 92 is not formed on the upper part of the semiconductor layer other than the trenches 40. However, as shown in FIG. 11 or FIG. 12, it may be arranged such that a mask layer 92 is formed on a whole upper surface of the semiconductor substrate and that the mask layer 92 on the gate electrodes 44 is thicker than in other regions. In such a configuration, the IGBT 10 in FIG. 1 can be also manufactured in a similar manner to that of the manufacturing method in the second example. In FIG. 12, although the upper surface of the mask layer 92 is flat, the mask layer 92 on the gate electrodes 44 is thicker than other portion because of the existence of the concave portions 56. When resistance of the mask layer 92 at the time of ion implantation is approximately the same as that in the semiconductor layer, the upper layer of the mask layer 92 may be flat as shown in FIG. 11.

In the IGBT 10 described above, although the emitter region 20 is extended along the trench 40, the above technique may be applied to an IGBT in which the emitter region 20 is extended to a direction orthogonal with the trench 40.

Figure 16:
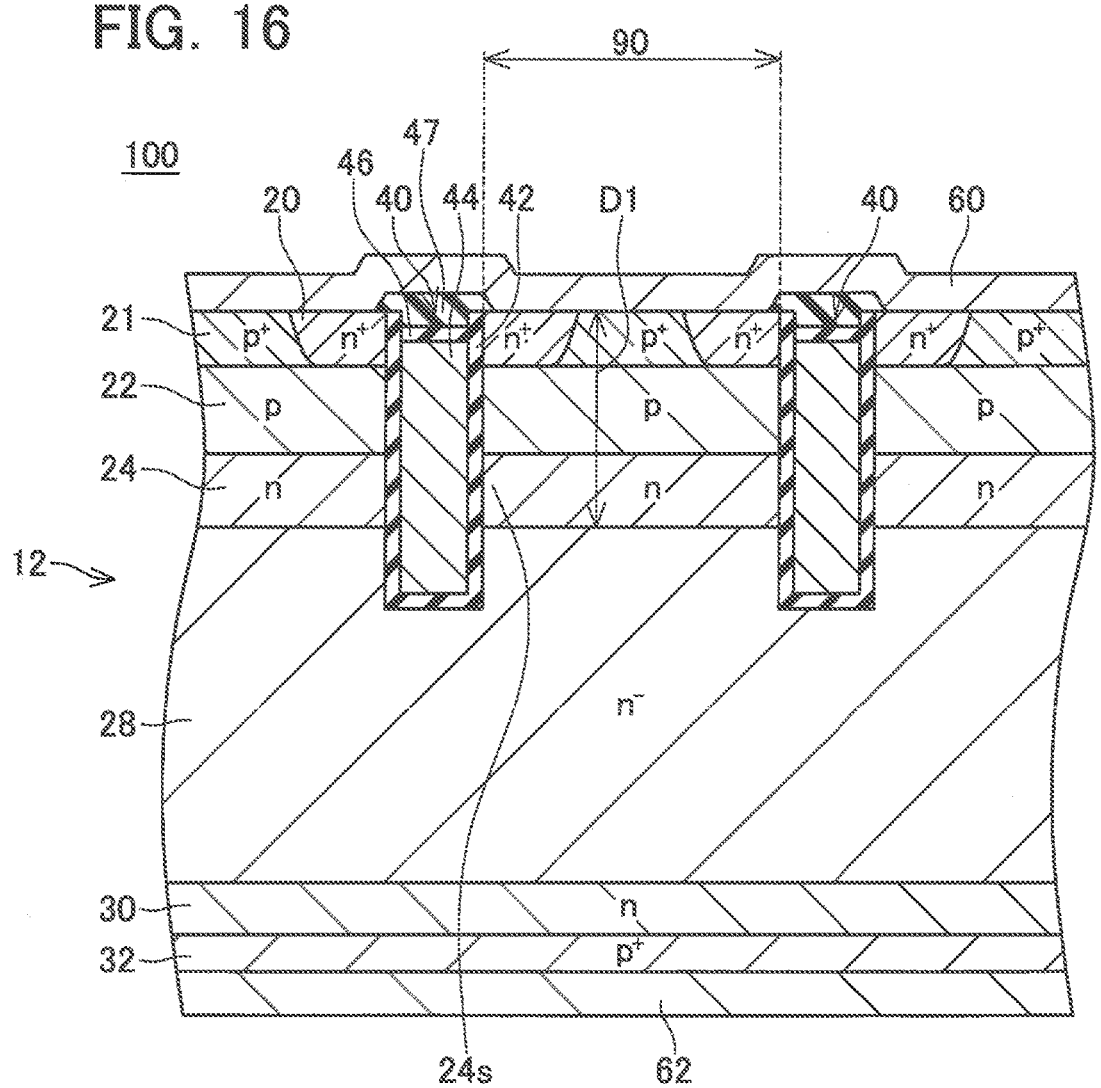
FIG. 16 is a cross-sectional view of an IGBT 100 according to a second embodiment.

Although the above IGBT 10 has the bottom body region 26, an IGBT 100 not having the bottom body region 26 as shown in FIG. 16 can also stabilize the characteristics of the IGBT (the gate threshold value, the ON voltage, and the capacitance of each gate electrode), by suppressing the variation of the position of the lower end of the intermediate region 24. The intermediate region 24 in FIG. 16 is disposed between the drift region 28 and the body region 22, and is a region in which the n-type impurity density is higher than that in the drift region 28. The n-type impurity density in the drift region 28 is approximately constant regardless of a position. That is, a boundary between a region in which n-type impurities are distributed in a substantially uniform density and a region in which n-type impurities are in a density higher than the substantially uniform density is a boundary between the intermediate region 24 and the drift region 28. In the IGBT 100 in FIG. 16, the variation of the depth D1 of the lower end of the intermediate region 24 located between the two gate electrodes 44 is equal to or less than 110 nm.

The IGBT 100 in FIG. 16 can be manufactured by a manufacturing method obtained by subtracting the ion implantation to the bottom body region 26 from the manufacturing method in any one of the first example to the fourth example. According to this manufacturing method, the variation ΔD1 of the depth D1 of the lower end of the intermediate region 24 can be set equal to or less than 110 nm.

Figure 15:
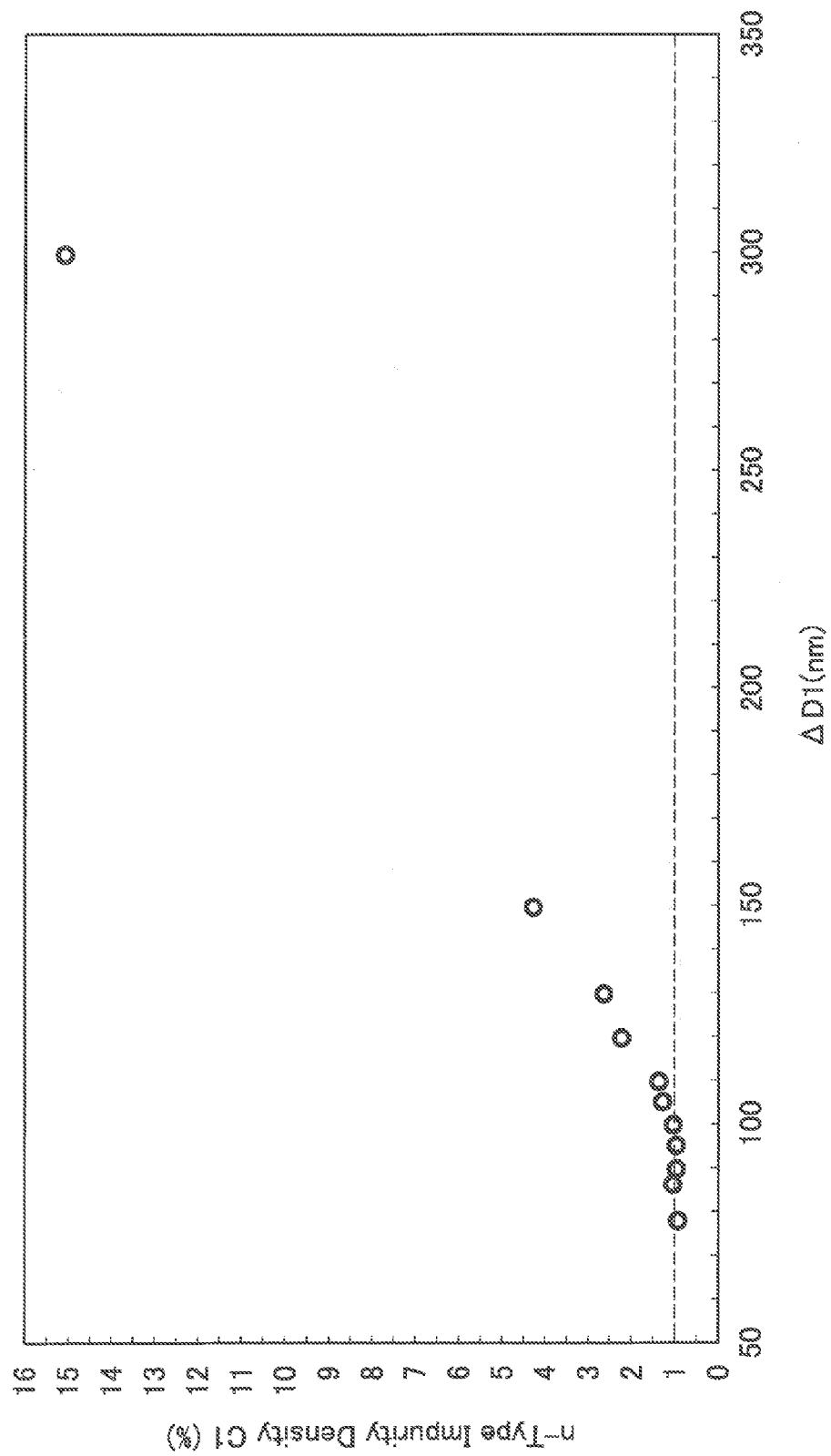
FIG. 15 is a graph showing a relationship between a variation $\Delta D1$ of a depth of a lower end of an intermediate region and an n-type impurity density $C1$ in the intermediate region in the vicinity of a gate insulating film, in an IGBT having no bottom body region.
Figure 19:
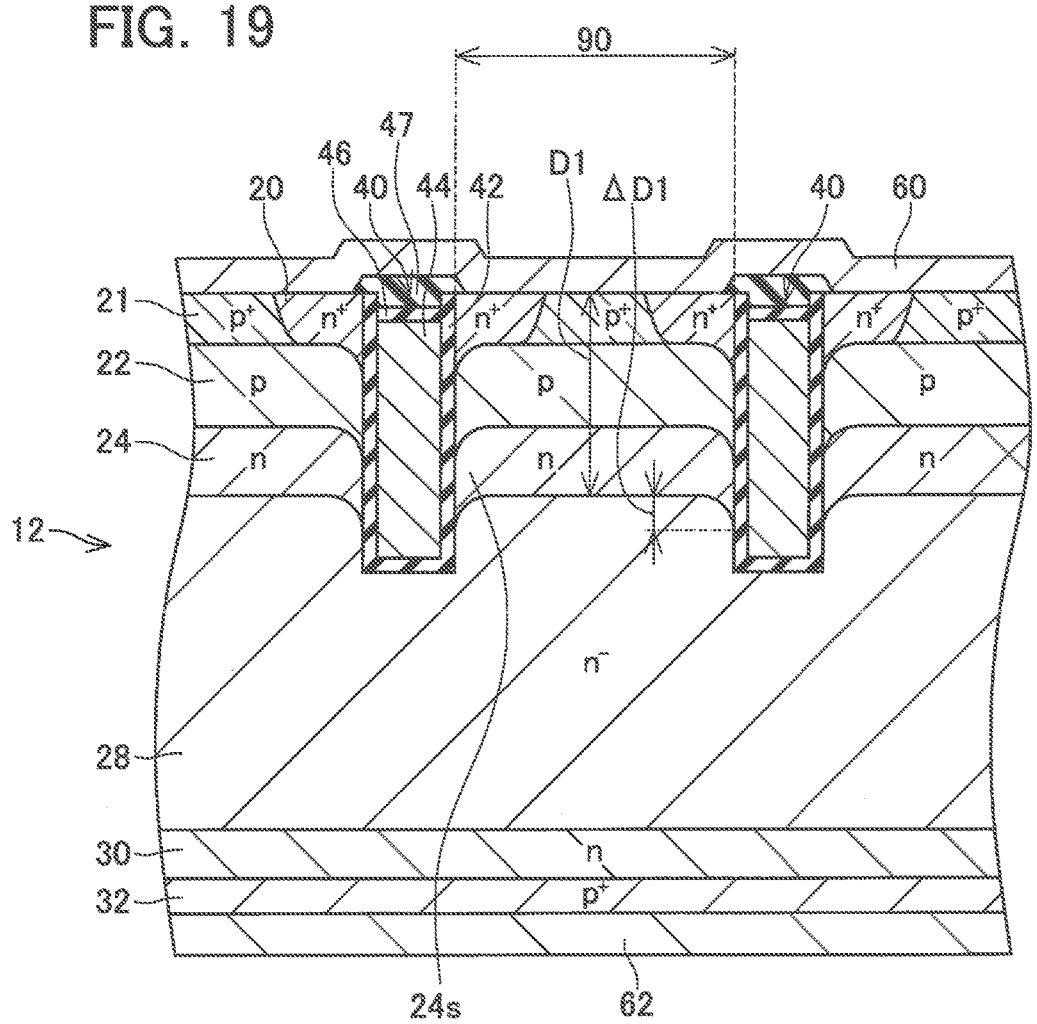
FIG. 19 is a cross-sectional view of a conventional IGBT having no bottom body region.

FIG. 15 shows a relationship between the variation ΔD1 (a difference between a depth of a shallowest position and a depth of a deepest position) of the depth D1 of the lower end of the intermediate region 24 in the region 90 between two gate electrodes 44 (refer to FIGS. 16 and 19) and the n-type impurity density C1 in an intermediate region 24s in the vicinity of the trench 40, in the IGBT having the intermediate region 24 and not having the bottom body region. For example, according to the conventional IGBT, the variation ΔD1 of a depth becomes a size of a portion indicated by the reference number ΔD1 in FIG. 19. Further, in the IGBT 100 in FIG. 16, because the ΔD1 is extremely small, the ΔD1 is not shown. As shown in FIG. 15, when the variation ΔD1 of a depth is larger than 110 nm, the n-type impurity density C1 greatly changes even when the variation ΔD1 of a depth changes only slightly. On the other hand, when the variation ΔD1 of a depth is equal to or less than 110 nm, the n-type impurity density C1 changes little even when the variation ΔD1 of a depth slightly changes.

In the IGBT 100 in FIG. 16, the variation ΔD1 of the depth D1 of the lower end of the intermediate region 24 is equal to or less than 110 nm. Therefore, by mass-producing the IGBT 100, the variation of the n-type impurity density C1 in the floating region 24s between the mass-produced IGBTs can be suppressed. Consequently, the IGBT of stable characteristics can be mass-produced.

The ion implantation method (a method of implanting impurities in a constant depth to a region in which a trench is formed) disclosed in the present specification can be also applied to a case of forming other semiconductor devices (for example, a MOSFET and a diode). Accordingly, characteristics of the semiconductor device can be improved. Consequently, the ion implantation method can be expressed as configuration 1 or configuration 2 below.

(Configuration 1) A method for manufacturing a switching element having:

an n-type or p-type region formed in a semiconductor substrate, a trench formed on an upper surface of the semiconductor substrate and penetrating the region, and a gate electrode formed in the trench and facing the area via an insulating film, the method having forming the trench on the upper surface of the semiconductor substrate, forming the insulating film in the trench, forming an electrode layer on the semiconductor substrate and in the trench, after forming the insulating film, planarizing an upper surface of the electrode layer, and implanting impurities to a depth of the region from a side of the upper surface of the semiconductor substrate, after planarizing the upper surface of the electrode layer.

(Configuration 2) A method for manufacturing a switching element having an n-type or p-type region formed in a semiconductor substrate, a trench formed on an upper surface of the semiconductor substrate and penetrating the region, and a gate electrode formed in the trench and facing the area via an insulating film, the method having forming the trench on the upper surface of the semiconductor substrate, forming the insulating film in the trench, forming the gate electrode in the trench so that an upper surface of the gate electrode is located at a lower side than an upper end of the trench, after forming the insulating film, forming a mask member on the gate electrode, or forming a mask member on the semiconductor substrate so that a thickness becomes larger on the gate electrode than in other regions, and implanting n-type impurities to a depth of the region from a side of the upper substrate of the semiconductor substrate, after forming the mask member.

While the examples are described in detail above, these are only exemplifications, and the examples do not limit claims. Techniques described in claims include various modifications and alterations of the above exemplifications.

Technical elements described in the present specification or the drawings exhibit technical utility by itself or by various combinations, and are not limited to combinations described in claims at the time of filing. Techniques exemplified in the present specification or the drawings simultaneously achieve a plurality of objects, and have technical utility by achieving one of the objects by itself.

The invention claimed is:

1. A method for manufacturing an IGBT, the IGBT comprising:
    an n-type emitter region;
    a p-type top body region formed under the emitter region;
    an n-type intermediate region formed under the top body region;
    a p-type bottom body region formed under the intermediate region;
    an n-type drift region formed under the bottom body region;
    a p-type collector region in contact with the drift region;
    a plurality of trenches penetrating the emitter region, the top body region, the intermediate region and the bottom body region from an upper surface of a semiconductor substrate and reaching the drift region; and
    gate electrodes formed in the trenches, each of which faces the top body region, the intermediate region and the bottom body region located between the emitter region and the drift region via an insulating film, the method comprising:
    forming the trenches on the upper surface of the semiconductor substrate;
    forming the insulating film in the trenches;
    forming an electrode layer on the semiconductor substrate and in the trenches after forming the insulating film;
    planarizing an upper surface of the electrode layer so that a variation of depth of the upper surface is a difference between a depth of a deepest position of the upper surface and a depth of a shallowest position of the upper surface and the variation of depth is less than or equal to 110 nm; and
    implanting n-type impurities through the planarized upper surface of the electrode layer, with the variation of depth being less than or equal to 110 nm, to a target region located at a depth of the intermediate region from a side of the upper surface of the semiconductor substrate after planarizing the upper surface of the electrode layer, wherein the target region continuously extends across portions of the electrode layer located in the trenches and portions of the semiconductor substrate located between the trenches.

2. The method according to claim 1, further comprising removing a portion of the electrode layer that includes the planarized upper surface after implanting the n-type impurities.

3. The method according to claim 1, wherein implanting the n-type impurities is performed in a state where a mask is not located on portions of the electrode layer above the trenches.

4. A method for manufacturing an IGBT, the IGBT comprising:
    an n-type emitter region;
    a p-type top body region formed under the emitter region;
    an n-type intermediate region formed under the top body region;
    a p-type bottom body region formed under the intermediate region;
    an n-type drift region formed under the bottom body region;
    a p-type collector region in contact with the drift region;
    a plurality of trenches penetrating the emitter region, the top body region, the intermediate region and the bottom body region from an upper surface of a semiconductor substrate and reaching the drift region; and
    gate electrodes formed in the trenches, each of which faces the top body region, the intermediate region and the bottom body region located between the emitter region and the drift region via an insulating film, the method comprising:
    forming the trenches on the upper surface of the semiconductor substrate;
    forming the insulating film in the trenches;
    forming the gate electrodes in the trenches after forming the insulating film so that upper surfaces of the gate electrodes are located at positions lower than upper ends of the trenches;
    forming a mask member on each gate electrode or forming a mask member on the semiconductor substrate so that the mask member is thicker on the gate electrodes than on other regions; and
    implanting n-type impurities through the mask member to a target region located at a depth of the intermediate region from a side of the upper surface of the semiconductor substrate after forming the mask member, wherein the target region continuously extends across portions of the electrode layer located in the trenches and portions of the semiconductor substrate located between the trenches.

5. The method according to claim 4, wherein the mask member is at least partly formed on the upper surfaces of the gate electrodes that are located at the positions lower than the upper ends of the trenches.

6. The method according to claim 4, wherein the mask member is formed on the semiconductor substrate so that the mask member is thicker on the gate electrodes than on other regions.

7. A method for manufacturing an IGBT, the IGBT comprising:
an n-type emitter region;
a p-type body region formed under the emitter region;
an n-type intermediate region formed under the body region;
an n-type drift region formed under the intermediate region, wherein an n-type impurity density in the drift region is lower than that in the intermediate region;
a p-type collector region formed under the drift region;
a plurality of trenches penetrating the emitter region, the body region and the intermediate region from an upper surface of a semiconductor substrate and reaching the drift region; and
gate electrodes formed in the trenches, each of which faces the body region located between the emitter region and the intermediate region via an insulating film,
the method comprising:
forming the trenches on the upper surface of the semiconductor substrate;
forming the insulating film in the trenches;
forming an electrode layer on the semiconductor substrate and in the trenches after forming the insulating film;
planarizing an upper surface of the electrode layer so that a variation of depth of the upper surface is a difference between a depth of a deepest position of the upper surface and a depth of a shallowest position of the upper surface and the variation of depth is less than or equal to 110 nm; and
implanting n-type impurities through the planarized upper surface of the electrode layer, with the variation of depth being less than or equal to 110 nm, to a target region located at a depth of the intermediate region from a side of the upper surface of the semiconductor substrate after planarizing the upper surface of the electrode layer, wherein the target region continuously extends across portions of the electrode layer located in the trenches and portions of the semiconductor substrate located between the trenches.

8. The method according to claim 7, further comprising removing a portion of the electrode layer that is outside the trenches and includes the planarized upper surface after implanting the n-type impurities.

9. The method according to claim 7, wherein implanting the n-type impurities is performed in a state where a mask is not located on portions of the electrode layer above the trenches.

10. A method for manufacturing an IGBT, the IGBT comprising:
an n-type emitter region;
a p-type body region formed under the emitter region;
an n-type intermediate region formed under the body region;
an n-type drift region formed under the intermediate region, wherein an n-type impurity density in the drift region is lower than that in the intermediate region;
a p-type collector region formed under the drift region;
a plurality of trenches penetrating the emitter region, the body region and the intermediate region from an upper surface of a semiconductor substrate and reaching the drift region; and
gate electrodes formed in the trenches, each of which faces the body region located between the emitter region and the intermediate region via an insulating film,
the method comprising:
forming the trenches on the upper surface of the semiconductor substrate;
forming the insulating film in the trenches;
forming the gate electrodes in the trenches after forming the insulating film so that upper surfaces of the gate electrodes are located at positions lower than upper ends of the trenches;
forming a mask member on each gate electrode or forming a mask member on the semiconductor substrate so that the mask member is thicker on the gate electrodes than on other regions; and
implanting n-type impurities through the mask member to a target region located at a depth of the intermediate region from a side of the upper surface of the semiconductor substrate after forming the mask member, wherein the target region continuously extends across portions of the electrode layer located in the trenches and portions of the semiconductor substrate located between the trenches.

11. The method according to claim 10, wherein the mask member is at least partly formed on the upper surfaces of the gate electrodes that are located at the positions lower than the upper ends of the trenches.

12. The method according to claim 10, wherein the mask member is formed on the semiconductor substrate so that the mask member is thicker on the gate electrodes than on other regions.

* * * * *